United States Patent [19]
Venkataraman

[11] Patent Number: 5,972,566
[45] Date of Patent: Oct. 26, 1999

[54] RELEASABLE PHOTOPOLYMER PRINTING PLATE AND METHOD OF FORMING SAME

[75] Inventor: Ravi Venkataraman, Cookeville, Tenn.

[73] Assignee: Identity Group, Inc., Cookeville, Tenn.

[21] Appl. No.: 08/861,285

[22] Filed: May 21, 1997

[51] Int. Cl.[6] .................................................. G03F 7/095
[52] U.S. Cl. ............................ 430/306; 430/15; 430/18; 430/258; 430/259; 430/273.1; 430/309; 430/394
[58] Field of Search ........................... 430/15, 18, 273.1, 430/306, 394, 14, 309, 258, 259, 262

[56] References Cited

U.S. PATENT DOCUMENTS

| | | | |
|---|---|---|---|
| 2,964,401 | 12/1960 | Plambeck | 430/281.1 |
| 2,993,789 | 7/1961 | Crawford | 430/281.1 |
| 3,877,939 | 4/1975 | Okai | 430/276.1 |
| 3,981,583 | 9/1976 | Tsuchida et al. | 355/85 |
| 4,087,182 | 5/1978 | Aiba et al. | 355/100 |
| 4,157,261 | 6/1979 | Takeda | 430/253 |
| 4,266,007 | 5/1981 | Hughes et al. | 430/306 |
| 4,286,043 | 8/1981 | Taylor, Jr. | 430/253 |
| 4,332,873 | 6/1982 | Huhes et al. | 430/15 |
| 4,444,607 | 4/1984 | Lash et al. | 156/58 |
| 4,576,898 | 3/1986 | Hoffman et al. | 430/306 |
| 4,647,524 | 3/1987 | Sullivan | 430/312 |
| 4,668,607 | 5/1987 | Wojcik | 430/281.1 |
| 4,732,829 | 3/1988 | Sullivan | 430/11 |
| 4,764,449 | 8/1988 | Van Iseghem | 430/162 |
| 4,897,327 | 1/1990 | Dubin et al. | 430/45 |
| 4,966,827 | 10/1990 | Sullivan | 430/270.1 |
| 5,035,981 | 7/1991 | Kurtz et al. | 430/327 |
| 5,182,056 | 1/1993 | Spence et al. | 264/22 |
| 5,252,428 | 10/1993 | Kawamoto et al. | 430/271.1 |
| 5,266,426 | 11/1993 | Tsuchiya et al. | 430/15 |
| 5,370,968 | 12/1994 | Goss et al. | 430/271.1 |
| 5,372,669 | 12/1994 | Freedman | 156/243 |
| 5,407,764 | 4/1995 | Cheema et al. | 430/15 |
| 5,750,315 | 5/1998 | Rach | 430/306 |
| 5,776,661 | 7/1998 | Casaletto et al. | 430/306 |

*Primary Examiner*—Bernard Codd
*Attorney, Agent, or Firm*—Reed Smith Shaw & McClay LLP; Raymond A. Miller

[57] ABSTRACT

The present invention is directed to an image plate comprised of a stiffening layer formed from a first photocured polymeric material and a print contact layer formed from a second photocured polymeric material wherein the first photocured polymeric material is a hard photocured polymeric material and the second photocured polymeric material is formed from a soft photocured polymeric material. The image plate is assembled as a photocured pre-cut sheet of relief images comprising a first layer formed from a releasable substrate, a second layer formed from a first photocured polymer, and a third layer formed from a second photocured polymer, wherein the first photocured polymer is formed from a hard photopolymer resin and the second photocured polymer is formed from a soft photopolymer resin. The method of forming releasable image plate is also disclosed which includes selectively photocuring a first and second liquid photosensitive material to form the releasable photocured image plate via light transmitted from a first light source through an image bearing negative and light transmitted from a second light source through a blank forming negative.

36 Claims, 4 Drawing Sheets

RELEASABLE PHOTOPOLYMER PRINTING PLATE AND METHOD OF FORMING SAME

FIELD OF INVENTION

The present invention relates generally to a photocured image plate. The present invention relates more specifically to a releasable photopolymer printing plate and a releasable substrate sheet which acts as a carrier for said releasable photopolymer printing plate as well as a method of forming said printing plate and releasable substrate sheet assembly.

BACKGROUND OF THE RELATED ART

It is known in the art that artwork or relief images can be formed by photocuring photosensitive polymeric material. This process is particularly useful in the formation of hand stamping devices and other printing devices which require a wide variety of images to be produced. Image plates for hand stamping devices are normally produced in a sheet containing multiple individual image plates due to the typically small size of the image plates or stamps being produced. Typically, the photocuring process involves laying down a negative on a photopolymer exposing unit such as a light box and pouring a liquid photopolymer over the negative to form a photopolymer layer to be cured. A substrate which includes an adhesive layer on the inner surface is then placed on top of the photopolymer. The photopolymer is exposed to light transmitted through the negative to create the desired relief image or group of letters on the stamp. The adhesive layer on the inner surface of the substrate creates a strong adhesive bond between the substrate backing material and the photopolymer used to create the image. This backing material rigidifies each of the individual stamps and provides a carrier for the photocured material. After the polymer material is photocured, the entire unit is washed and final cured. Thereafter, individual stamps or image plates are cut from the continuous carrier sheet.

As an example, U.S. Pat. No. 3,848,998 discloses a process and apparatus for producing a photopolymer plate incorporating relief images thereon which includes an apparatus for developing the photopolymer plate. An image-bearing transparency is placed on a rigid glass plate capable of transmitting actinic radiation. A sheet of protective film which is also capable of transmitting actinic radiation is placed over the image bearing transparency. A layer of liquid photosensitive material is then applied to the upper surface of the sheet of protective film material and a sheet of backing material is laminated onto the upper surface of the photosensitive layer to form an assembly. The photosensitive layer is then exposed to photocuring light through the transparent portions of the image bearing transparency. The sheet of protective film material is then removed from the lower surface of the exposed photosensitive layer to reveal the photocured photopolymer layer and the sheet of laminated backing material. This assembly is then washed in order to remove the unhardened, nonexposed, photosensitive material. The relief image remains on the sheet of backing material as an integral assembly. In order to obtain individual image plates it is necessary to cut them from the integral assembly. The relief image formed on the sheet of backing material may then be used on a variety of printing equipment.

U.S. Pat. No. 4,087,182 is a modified version of the above-identified patent. This reference utilizes a second or auxiliary light source located above the backing material. A dotted image-bearing sheet may be used to cover the auxiliary light source. The dots are preferably sized such that 30 to 150 lines of dots per inch are formed on the sheet. The dots increase transmittance of radiation to the sheet and can form projections or studs between the larger projections which are exposed to light from the bottom light source in order to prevent unwanted compression of the studs and smearing.

The related art requires the substrate as backing material to provide sufficient strength and rigidity to the image-bearing relief plate. The related art also requires sheets containing multiple relief images or individual stamps to be cut from the sheet. The cutting of individual stamps can be particularly problematic because after cutting the stamps from the sheet there is no means to maintain them in a pre-defined orientation.

OBJECTS OF THE INVENTION

It is an object of the present invention to produce image plates which can be peeled away from a substrate carrier material.

It is another object of the present invention to form image plates which are sufficiently rigid after releasing them from the substrate material to prevent distortion. It is another object of the present invention to form image plates which are sufficiently soft to make or form an acceptable image or impression on the surface to be printed on.

It is another object of the present invention to form pre-cut individual stamps or image plates.

It is yet another object of the present invention to form an image plate from multiple photocured polymeric layers.

It is yet another object of the present invention to provide a system of forming image plates which can be altered without requiring excess stock of starting materials (i.e. varying thickness of backing material).

It is yet another object of the present invention to provide a releasable image plate which can be carried and properly oriented on a releasable substrate until needed.

These and other objects of the present invention will become apparent from the followed description and the claims appended hereto.

SUMMARY OF THE INVENTION

The present invention is directed to an image plate including a stiffening layer which is formed from a first photocured polymer and a print contact layer formed from a second photocured polymer. A releasable substrate may act as a carrier of multiple image plates. Gaps or borders which do not include any photocured polymer are formed around each of the individual image plates when they are on the substrate material. The present invention is also directed to a releasable relief image plate assembly which includes a first layer formed from a releasable substrate. After photocuring, the releasable image plate comprised of hard and soft photopolymer can be removed or peeled away from the releasable substrate.

Finally, a method for forming the image plate and image plate-substrate assembly includes placing an image bearing negative over a first or lower light source, applying a liquid photosensitive material over the first light source, applying a second liquid photosensitive material over the first liquid photosensitive material, feeding a releasable substrate material over the second liquid photosensitive material, and photocuring the first and second liquid photosensitive material to form sheets of pre-cut image plates. This method can include the step of interposing a protective coating between the image bearing negative and the first liquid photosensitive material in order to protect the image bearing negative from exposure to the photosensitive material and to allow the image bearing negative to be used again. The method disclosed herein also includes the step of providing a blank forming negative or background forming negative which can be placed over the releasable substrate. This allows light from a second or upper light source to be selectively blocked to produce frames of uncured photopolymer around each of the individual photocured cured image plates. The method disclosed herein also includes washing away any uncured photopolymeric material and drying the photocured sheet of pre-cut relief images.

BRIEF DESCRIPTION OF THE DRAWINGS

The invention will become more readily apparent from the following description of preferred embodiments thereof shown, by way of example only, in the accompanying drawings, wherein.

DETAILED DESCRIPTION OF THE INVENTION

Figure 1:
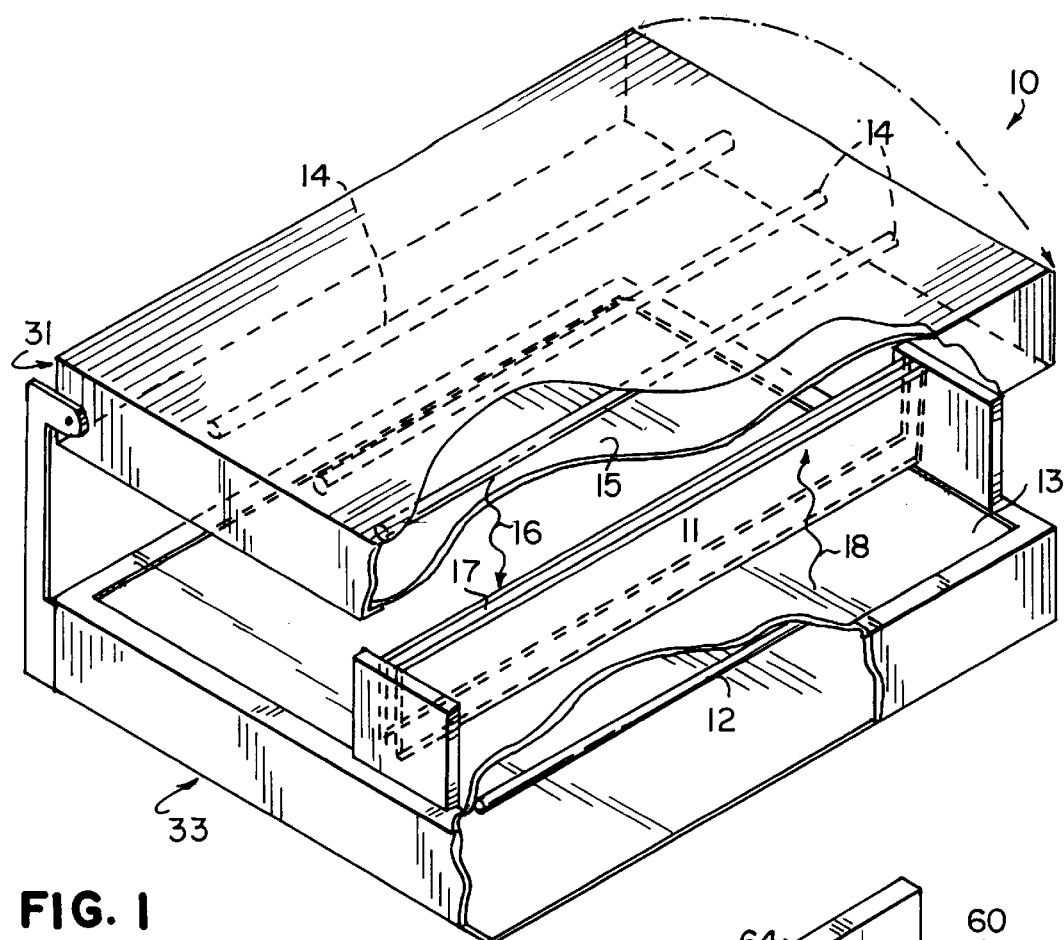
FIG. 1 is an isometric view of the exposure unit used in the present invention.
Figure 6:
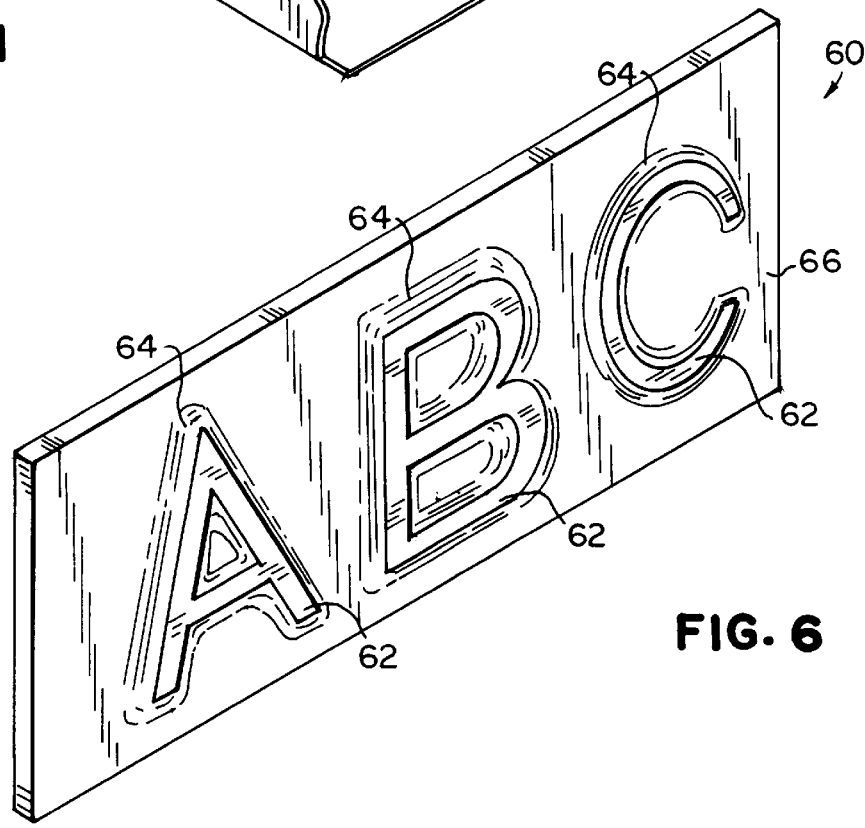
FIG. 6 is a perspective view of a completed photocured release image plate.

Referring to FIG. 1, an embodiment of the apparatus utilized in forming a photopolymer image plate having relief images thereon is indicated by reference number 10 and will be referred to hereinafter as exposure unit 10. Exposure unit 10 includes a bottom unit 33 with a lower light source 12 and a lower transparent surface 13. Exposure unit 10 may also include a top unit 31 which may include an upper light source 14 and an upper transparent surface 15. The lower transparent surface 13 allows transmission of light 18 from the lower light source 12 and the upper transparent surface 15 allows transmission of light 16 from the upper light source 14. The relief images of image plate 60 best shown in FIG. 6 are formed by exposing photocurable polymer to both the upper light source 14 and the lower light source 12. The upper transparent surface 15 may also function to disperse the photopolymer layers in an even fashion. A Merigraph™ 1216 exposure unit was used in the current process, but it should be understood that any exposure unit which provides upper and lower light sources sufficient to photocure the polymers would be acceptable for use in the present invention.

The exposure unit 10 also includes a dispensing blade 11 which dispenses the photocurable polymer. Thus, the dispensing blade 11 of exposure unit 10 may include a photopolymer dispensing trough 17 which is filled with liquid photopolymer. Although it is preferable to utilize the dispensing blade 11 and the dispensing trough 17 to distribute the liquid photopolymer resin, the liquid photopolymer resins discussed herein may simply be poured directly onto a surface and distributed evenly with a flat edged tool.

As used herein, the terms photocured pre-cut sheet of relief images 36; releasable relief image plate 38; and image plate 60 refer generally to the image plate 60 at different stages of assembly. In other words, image plate 60 is the end product; prior to the image plate 60 being removed from the releasable substrate 26 the image plate portion is referred to as releasable image plate 38; and the composite structure of releasable substrate 26 and releasable image plate 38 is referred to as a photocured pre-cut sheet of relief images 36.

Figure 2:
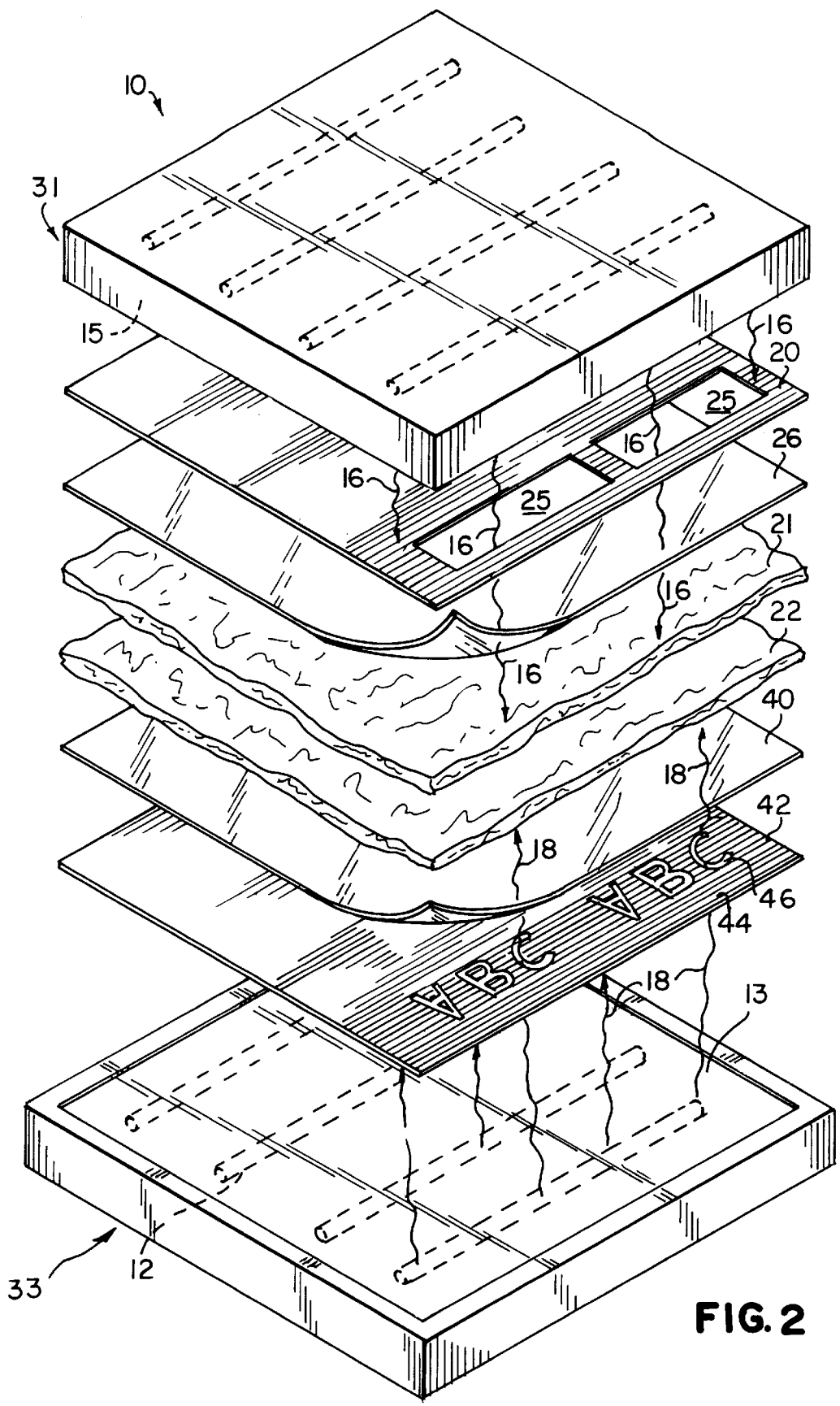
FIG. 2 is an exploded isometric view of the exposure unit which illustrates layers of the components involved in the present invention.
Figure 3:
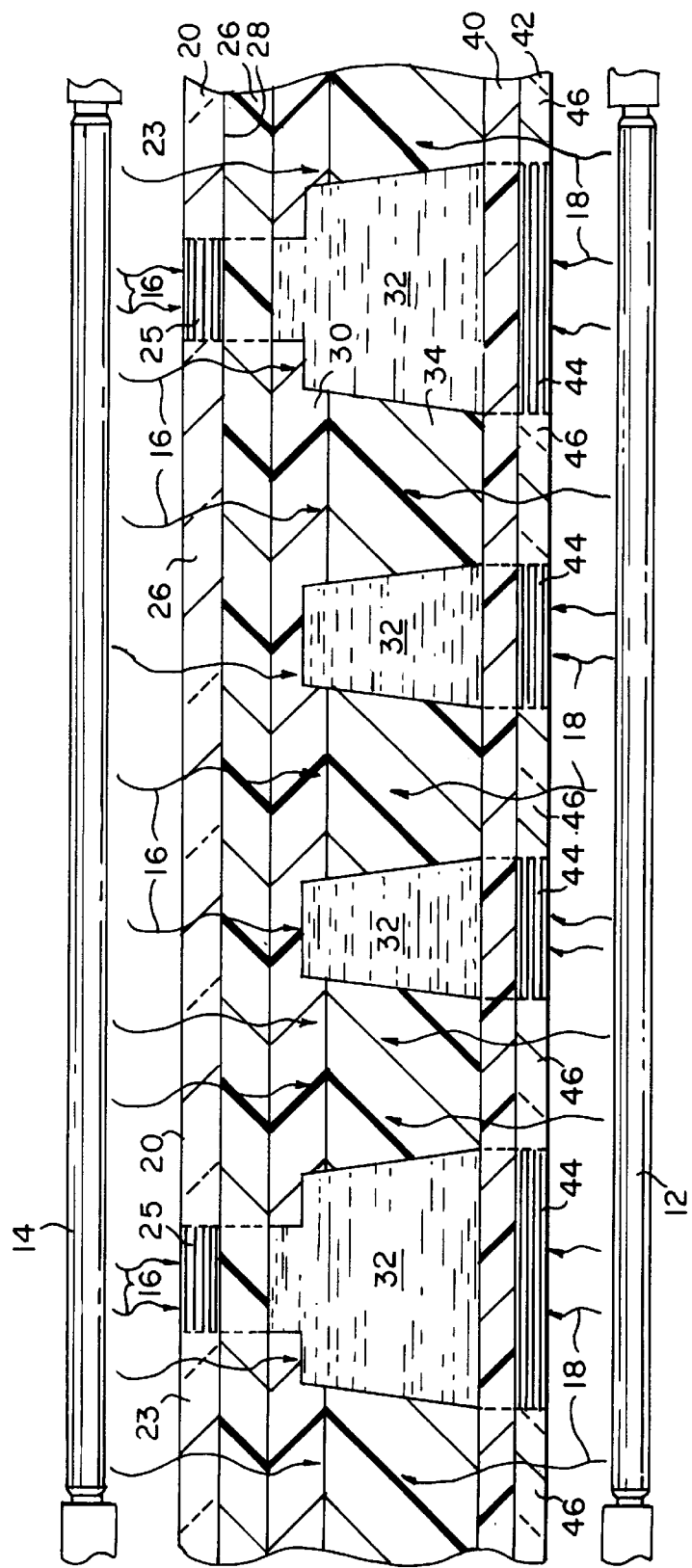
FIG. 3 is a cross-sectional view of the compressed components.

As can be seen in FIGS. 2 and 3 the process of the present invention includes placing the image bearing negative 42 on top of or over the lower transparent surface 13 of lower light source 12 to selectively transmit and block light from the lower light source 12 in order to form the relief image of the releasable relief image 38. The image bearing negative 42 is transparent to the lower light source in the shape or design of the image to be formed by the photopolymer. The image bearing negative 42 is then covered with a release film 40 which protects the lower transparent surface 13, the image bearing negative 42, and bottom unit 33, from contact with the photocurable polymer. This allows the image bearing negative 42 to be used multiple times without substantial cleaning and protects the exposure unit 10 from being gummed up by the photopolymer resin being used. The release film 40 by virtue of being covered with, or consisting of, some type of releasable material (i.e. the inner side 41 of the release film 40 being coated with a release coating such as silicon or other suitable material) can be removed after photocuring the photopolymer. A vacuum can be applied from the underside of the image bearing negative 42 and release film 40 to remove any wrinkles. Any bubbles in the release film 40 can be flattened out at this time. The dispensing blade 11 is then used to dispense a liquid photopolymer resin layer 22 over the image bearing negative 42. When photocured, first photopolymer resin layer 22 will comprise the portion of the image plate 60 which contacts the surface of the material to be printed on. Dispensing blade 11 mechanically moves (FIG. 1) to dispense liquid photopolymer layer 22 via photopolymer dispensing trough 17 in an even fashion. The dispensing blade 11 may include a second trough (not shown) which may be used to dispense more or a second photopolymer. The dispensing blade 11 is normally returned to the starting position and a second liquid photopolymer resin layer 21 is dispensed via photopolymer dispensing trough 17 to distribute second photopolymer resin layer 21 evenly across the top of the first liquid photopolymer resin layer 22. It should be noted that it is necessary to either raise the dispensing blade 11 or replace the dispensing blade with a second dispensing blade (not shown) which is situated higher than the dispensing blade 11 so that during the second pass, the second photopolymer resin layer 21 is layered over the first photopolymer resin layer 22 rather than the second photopolymer resin layer 21 displacing large amounts of the first photopolymer resin layer 22. Finally, a releasable substrate 26 which usually consists of a mylar substrate is laid down over the second liquid photopolymer resin layer 21. The releasable substrate 26 does not have an adhesive on its inner side or is minimally adhesive.

As can be seen in FIG. 2, the result, in cross-section, is image bearing negative 42, first photopolymer resin layer 22 (preferably a "soft" photopolymer resin), second photopolymer resin layer 21 (preferably a "hard" photopolymer resin), and releasable substrate 26. To complete the assembly to be exposed to light, a blank forming negative 20 is placed on the top of the releasable substrate 26. The entire assembly is shown in an exploded isometric view in FIG. 2.

It has been found that it is preferable to attach the blank forming negative 20 to the releasable substrate 26 and/or bottom unit 33 in order to ensure that the blank forming negative 20 and the image bearing negative 42 line up. Alternatively, it is possible to expose the assembly to be photocured to lower light or radiation 18 from lower light source 12 to stiffen the photopolymers before placing the blank forming negative 20 on top of the releasable substrate 26. The rationale behind this is that the image bearing negative 42 and the blank forming negative 20 must line up to the extent that the blank forming negative 20 blocks light from around the edges of the image plate 60 to be formed. If the photopolymer is not at least quasi-hard, the blank negative may shift substantially out of alignment. The alternative method is less preferred because it results in a relief image plate 60 that is not as well defined or sharp as the method of attaching the blank forming negative 20 to the releasable substrate 26 and the bottom unit 33.

FIG. 3 is a cross-sectional view of the photocuring process illustrating the selective application of light and the presence of uncured photopolymer 32. Similarly, as can be clearly seen in FIG. 3 lower radiation 18 from lower light source 12 can be selectively transmitted via light transmitting portion of image bearing negative 46 and selectively blocked via light blocking portion of image bearing negative 44 and upper radiation 16 from upper light source 14 can be selectively transmitted via light transmitting portion of blank forming negative 23 and selectively blocked via light blocking portion of blank forming negative 25 to form the photocured pre-cut sheet of relief images.

Figure 4:
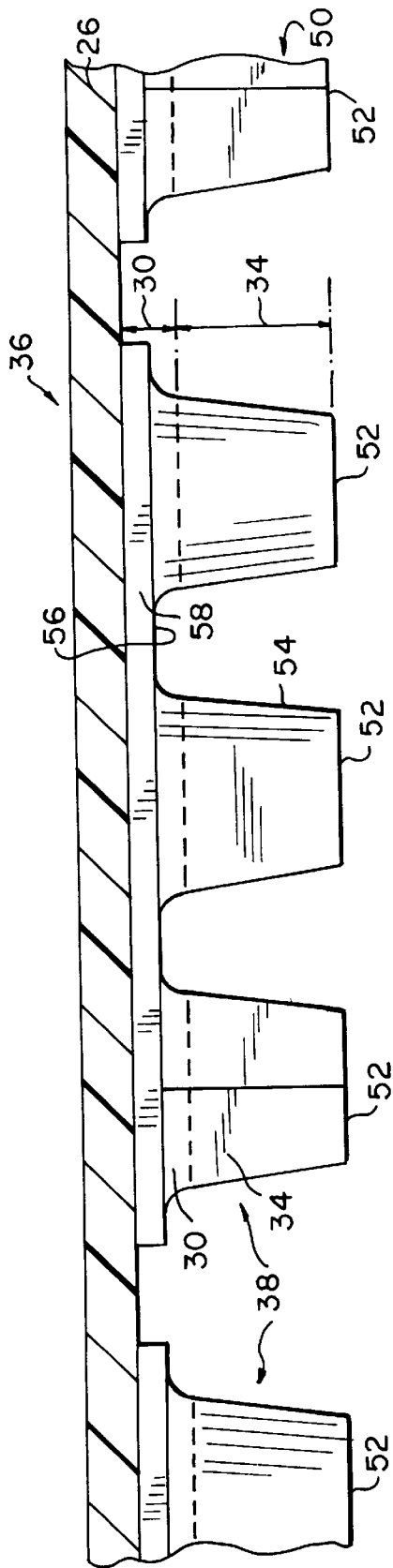
FIG. 4 is a side view of a sheet of releasable image plates.

Turning to FIG. 4, after the liquid photopolymer resin layers 21, 22 have been sufficiently cured by upper radiation 16 and lower radiation 18 to form first photocured polymeric layer 30 and second photocured polymeric layer 34 of the releasable relief image plate 38, the top unit 31 of exposure unit 10 is lifted or released and the photocured pre-cut sheet of relief images 36 is removed therefrom to reveal substantially what is shown in FIG. 4. Uncured photopolymer portion 32 will remain on the photocured pre-cut sheet of relief images 36 and should be washed off. The photocured pre-cut sheet of relief images 36 is placed in a washing machine i.e. a roll type washing machine, to wash the uncured photopolymer 32 from the interstices of photocured pre-cut sheet of relief images 36. The wash machine used in the present invention is the Merigraph™ 1624 developing station.

Figure 5:
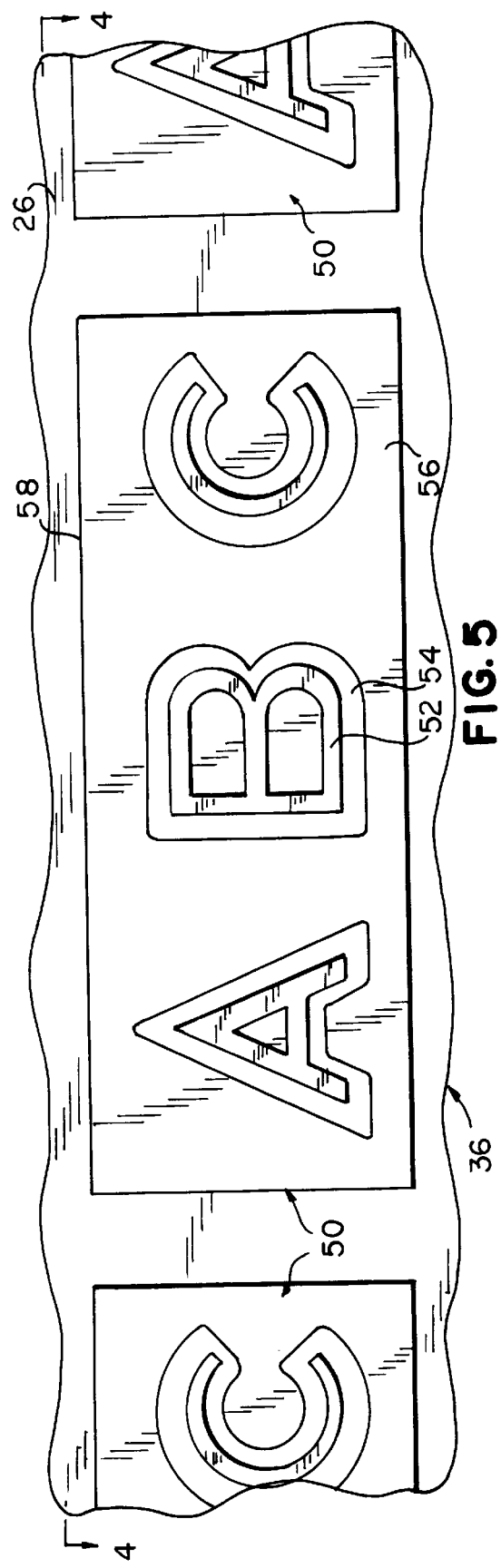
FIG. 5 is a front view of a photocured sheet of releasable image plates.

After being washed the photocured pre-cut sheet of relief images 36 is rinsed with clean water and post-exposed for a finite period of time (usually about 1 minute). At this time the photocured pre-cut sheet of relief images 36 is rinsed one more time with clean water and dried in an oven or with hot air. The photocured pre-cut sheet of relief images 36 of the present invention is best shown in FIGS. 4 and 5. The photocured pre-cut sheet of relief images 36 is comprised of a first layer formed from a releasable substrate 26, the first photocured polymeric layer 30, and the second photocured polymeric layer 34. The releasable substrate 26 acts as a carrier of releasable relief image plate 38 which, after being photocured, can be easily peeled away from the releasable substrate 26 resulting in image plate 60. Looking at photocured pre-cut sheet of relief images 36 as an integral unit, the first photocured polymeric layer 30 forms a second layer on the photocured pre-cut sheet of relief images 36. This second layer is formed from the second photopolymer resin layer 21 and is developed or photocured substantially via exposure to upper radiation 16 illustrated as downwardly projecting arrows in the drawing. Finally, the photocured pre-cut sheet of relief images 36, looked at as an integral unit, is formed with a third layer from a second photocurable polymer 34.

This second photocured polymeric layer 34 is hardened or photocured substantially via lower light source 12 and the lower radiation 18 produced therefrom as identified by the upwardly projecting arrows in FIG. 3. It is to be understood herein that the term front-wise radiation can be used interchangeably with lower radiation 18 and the term back-wise radiation can be used interchangeably with upper radiation 16.

Upon being exposed to light, the second photopolymer resin layer 21 provides a stiffening means for releasable relief image plate 38. In order to provide proper stiffening, the second photopolymer resin layer 21 is preferably a "hard" photopolymer resin. As used herein, a hard photopolymer resin has a Durometer rating that is preferably in the range of 65 to 100 Shore A, more preferably in the range of 80 to 100 Shore A, and even more preferably approximately 90 Shore A. Although it would be possible to form the releasable relief image plate 38 from the hard polymer resin above, the resulting product would be less satisfactory than the use of a second photocured polymeric layer 34 formed from a "soft" first photopolymer resin layer 22. This is due to the fact that the hard polymer in contact with the surface to be printed on is too rigid to lay the ink down in a consistent pattern on the paper. In addition, hard photopolymers do not pick up ink as well as soft polymers and they therefore do not carry ink to the material to be printed on in a consistent and regular basis.

As described above and shown in FIG. 2, the third layer of the photocured pre-cut sheet of relief images 36 is formed from a soft first photopolymer resin layer 22. As used herein, "soft" photopolymer resin has a Durometer rating that is preferably in the range of 20 to about 60 Shore A, even more preferably in the range of 30 to 50 Shore A, and most preferably approximately 35–40 Shore A. As discussed above with regard to hard polymers, it would be possible and has been contemplated herein to form the image plate 60 entirely from a soft photopolymer. However, an unreliable image plate 60 results when soft photopolymer is used alone because among other deficiencies the image forming projection 54 can be pushed into image forming recesses 56 resulting in smearing of the relief image to be placed on the printed paper. Additionally, in order to peel the releasable image plate 38 from the releasable substrate 26, considerable force is required. This force often results in ripping, stretching, or disfiguration of the releasable relief image plate 38.

Accordingly, it is preferable to form the releasable relief image plate 38 from a hard first photocured polymeric layer 30 and a soft second photocured polymeric layer 34. The first photocured polymeric layer 30 provides sufficient backing strength and resiliency to image plate 38 so that it can be removed from the releasable substrate 26 without ripping, tearing, or deformation and the soft second photocured polymeric layer 34 provides preferred ink retention and pick up and print quality characteristics in the image plate 60.

The thickness of the layer formed by second photopolymer resin layer 21 (hard) and first photopolymer resin layer 22 (soft) can be varied to harden or soften the end image plate 60 as desired. The desired thickness of the releasable substrate 26 is preferably in the range of 2 mil. to 10 mil., even more preferable in the range of 3 to 7 mil., and most preferably approximately 4 mil. In a typical example the photocured pre-cut sheet of relief images 36 has a thickness in the range of 80 to 120 mil. thick with the second photopolymer resin layer 21 (hard) layer being 4% to 40% of the total thickness of the photocured pre-cut sheet of relief images 36 i.e., 4 mil. to 40 mil., with the soft second photocured polymeric layer 34 normally in the range of 55–90% of the total thickness of photocured pre-cut sheet of relief images 36.

The present invention provides a number of desirable characteristics for image plates used in the printing or stamp forming industry. By using the blank forming negative 20 to block the upper radiation 16, the present invention enables one to form borders around each of the releasable relief image plates 38 to thereby avoid the necessity of cutting individual relief images from a continuous sheet. It is preferable to have at least a 1/16" gap between each of the releasable relief image plates 38 to ensure a clean peel off. However, in some cases a little less of a gap is acceptable. The releasable substrate 26 also provides a carrier means to allow the releasable relief image plate 38 to be maintained in an orientation for tapid removal and alignment in the finished product (i.e. a hard stamp). Another advantage to the present invention is that the thickness of the backing material can be easily manipulated without the need to have a number of backing substrates of various thicknesses on hand. In addition, the releasable substrate 26 is reusable and reduces the amount of mylar substrate necessary to produce the releasable relief image plate 38.

It should be evident that this disclosure is by way of example, and that various changes may be made by adding, modifying or eliminating details without departing from the fair scope of the teaching contained in this disclosure. The invention therefore is not limited to particular details of this disclosure except to the extent that the following claims are necessarily so limited.

What is claimed is:

1. An image plate sheet comprising:
   a substrate material;
   a backing layer formed from a first photocured polymer, said backing layer being releasably adhered to said substrate material; and
   a print contact layer formed from a second photocured polymer, said print contact layer being integrally joined to said backing layer to thereby form an image plate, said image plate being formed in a discontinuous manner to thereby provide a sheet of pre-cut image plates.

2. The sheet of claim 1, wherein individual image plates may be selectably removed from said substrate material.

3. The sheet of claim 1, wherein said first photocured polymer is formed from a photopolymer resin which when polymerized has sufficient mechanical strength to support image plates independent of said substrate material.

4. The sheet of claim 1, wherein said first photocured polymer has a Durometer rating in the range of 65–100 Shore A.

5. The sheet of claim 1, wherein said print contact layer is formed from a photopolymer resin, which when polymerized is suitable for transferring ink.

6. The sheet of claim 1, wherein said print contact layer has a Durometer rating in the range of 20–60 Shore A.

7. A method of forming an image plate assembly comprising:
   placing an image bearing negative between a light source and a liquid photosensitive material;
   placing a carrier material adjacent to said liquid photosensitive material; and
   photocuring said liquid photosensitive material to form the image plate said step of photocuring said liquid photosensitive material including the step of releasably joining the carrier material and the image plate to form an image plate assembly as a sheet of pre-cut image plates.

8. The method of claim 7, further including the step of removing the image plate from the carrier material.

9. The method of claim 7, further comprising the step of interposing a protective coating between said image bearing negative and said liquid photosensitive material.

10. The method of claim 7, further comprising the step of placing a blank forming negative over said carrier material.

11. The method of claim 10, wherein said step of photocuring includes transmitting light from said light source through said image bearing negative.

12. The method of claim 11, wherein said step of photocuring further includes selectively transmitting light from a light source through said blank forming negative.

13. The method of claim 12, wherein said light transmitted through said image bearing negative is selectively transmitted to photocure the liquid photosensitive material in a configuration corresponding to that of the image bearing negative.

14. The method of claim 7, further including the step of washing to remove uncured polymeric material from said image plate.

15. The method of claim 7, wherein said image plate is formed from a first and a second photocurable polymer resin.

16. The method of claim 7, wherein said liquid photosensitive material is photocured in a discontinuous manner to thereby form individual relief plates which can be selectable removed from said substrate material without cutting.

17. A method of forming an image plate assembly comprising:
   placing an image bearing negative between a light source and a liquid photosensitive material;
   placing a carrier material adjacent to said liquid photosensitive material; and
   photocuring said liquid photosensitive material to form the image plate, said step of photocuring said liquid photosensitive material including the step of releasably joining the carrier material and the image plate to form an image plate assembly wherein a plurality of image plates are formed on a sheet.

18. The method of claim 17, wherein individual image plates are selectably removed from said sheet.

19. The method of claim 17, further comprising the step of interposing a protective coating between said image bearing negative and said liquid photosensitive material.

20. The method of claim 17, further comprising the step of placing a blank forming negative over said carrier material.

21. The method of claim 20, wherein said step of photocuring includes transmitting light from said light source through said image bearing negative.

22. The method of claim 21, wherein said step of photocuring further includes selectively transmitting light from a light source through said blank forming negative.

23. The method of claim 22, wherein said light transmitted through said image bearing negative is selectively transmitted to photocure the liquid photosensitive material in a configuration corresponding to that of the image bearing negative.

24. The method of claim 17, further including the step of washing to remove uncured polymeric material from said image plate.

25. The method of claim 17, wherein said image plate is formed from a first and a second photocurable polymer resin.

26. The method of claim 25, wherein the image plate includes a print contact layer, said print contact layer formed from said second photocurable polymer resin and having a Durometer rating in the range of 20–60 Shore A.

27. The method of claim 17, wherein said liquid photosensitive material is photocured in a discontinuous manner to thereby form individual relief plates which can be selectably removed from said carrier material without cutting.

28. A method of forming an image plate assembly comprising:

placing an image bearing negative between a light source and a liquid photosensitive material;

placing a carrier material adjacent to said liquid photosensitive material; and photocuring said liquid photosensitive material to form the image plate, said step of photocuring said liquid photosensitive material including the step of releasably joining the carrier material and the image plate to form an image plate assembly wherein a plurality of plates are formed on a sheet and wherein individual image plates are selectably removable from said sheet.

29. The method of claim 28, further including the step of removing the image plate from the carrier material.

30. The method of claim 28, further comprising the step of interposing a protective coating between said image bearing negative and said liquid photosensitive material.

31. The method of claim 28, further comprising the step of placing a blank forming negative over said carrier material.

32. The method of claim 31, wherein said step of photocuring includes transmitting light from said light source through said image bearing negative.

33. The method of claim 32, wherein said step of photocuring further includes selectively transmitting light from a light source through said blank forming negative.

34. The method of claim 33, wherein said light transmitted through said image bearing negative is selectively transmitted to photocure the liquid photosensitive material in a configuration corresponding to that of the image bearing negative.

35. The method of claim 28, wherein said image plate is formed from a first and a second photocurable polymer resin.

36. The method of claim 35, wherein the image plate includes a backing layer formed from said first photocurable polymer resin, said backing layer having a Durometer rating in the range of 65–100 Shore A.

* * * * *